(12) United States Patent
Harayama

(10) Patent No.: US 11,292,199 B2
(45) Date of Patent: Apr. 5, 2022

(54) BUILDING APPARATUS AND BUILDING METHOD

(71) Applicant: MIMAKI ENGINEERING CO., LTD.

(72) Inventor: Kenji Harayama, Nagano (JP)

(73) Assignee: MIMAKI ENGINEERING CO., LTD., Nagano (JP)

( * ) Notice: Subject to any disclaimer, the term of this patent is extended or adjusted under 35 U.S.C. 154(b) by 752 days.

(21) Appl. No.: 16/247,600

(22) Filed: Jan. 15, 2019

(65) Prior Publication Data

US 2019/0217544 A1  Jul. 18, 2019

(30) Foreign Application Priority Data

Jan. 17, 2018  (JP) .............................. JP2018-005876

(51) Int. Cl.
| | |
|---|---|
| *B29C 64/393* | (2017.01) |
| *B33Y 50/02* | (2015.01) |
| *B29C 64/129* | (2017.01) |
| *B29C 64/40* | (2017.01) |
| *B33Y 10/00* | (2015.01) |
| *B29C 64/209* | (2017.01) |
| *B29C 64/112* | (2017.01) |
| *G06F 30/00* | (2020.01) |
| *B33Y 30/00* | (2015.01) |

(52) U.S. Cl.
CPC .......... *B29C 64/393* (2017.08); *B29C 64/112* (2017.08); *B29C 64/129* (2017.08); *B29C 64/209* (2017.08); *B29C 64/40* (2017.08); *B33Y 10/00* (2014.12); *B33Y 50/02* (2014.12); *G06F 30/00* (2020.01); *B33Y 30/00* (2014.12)

(58) Field of Classification Search
CPC ... B29C 64/112; B29C 64/129; B29C 64/209; B29C 64/393; B29C 64/40; B33Y 10/00; B33Y 30/00; B33Y 50/02; G06F 30/00
See application file for complete search history.

(56) References Cited

U.S. PATENT DOCUMENTS

2015/0328839 A1* 11/2015 Willis ................ G05B 19/4099
   700/98
2021/0129377 A1* 5/2021 Mo ........................ B28B 1/001

FOREIGN PATENT DOCUMENTS

JP         2015071282         4/2015

\* cited by examiner

*Primary Examiner* — Yuhui R Pan
(74) *Attorney, Agent, or Firm* — JCIPRNET

(57) ABSTRACT

To provide a building system for building an object, including a building apparatus that ejects a material of the object, a data generation unit, and a control unit. The data generation unit generates ejection position designating data based on input data indicating the object in a format different from that of the ejection position designating data. During a time when the data generation unit performs an operation of generating the ejection position designating data, the control unit causes a head to form a plurality of material layers constituting at least a part of the object, and sets a layer forming start timing for starting to form the material layers so that the interlayer time does not exceed an upper limit time set in advance. Hence, appropriately building a high quality object.

11 Claims, 4 Drawing Sheets

BUILDING APPARATUS AND BUILDING METHOD

CROSS REFERENCE TO RELATED APPLICATIONS

This application claims the priority benefit of Japanese Patent Application No. 2018-005876, filed on Jan. 17, 2018. The entirety of the above-mentioned patent application is hereby incorporated by reference herein and made a part of this specification.

BACKGROUND OF THE INVENTION

Technical Field

The present disclosure relates to a building apparatus and a building method.

Background Art

In the related art, there is known a building apparatus (3D printer) for building an object using an inkjet head (for example, refer to Japanese Unexamined Patent Publication No. 2015-071282). With such a building apparatus, for example, the object is built by additive manufacturing by overlapping a plurality of layers of ink formed by the inkjet head.

Patent Literature 1: Japanese Unexamined Patent Publication No. 2015-071282

SUMMARY

In a case of building an object with a building apparatus, for example, it can be considered that data indicating the object to be built is converted to a format adapted to a configuration of the building apparatus, and building operation is performed in accordance with the converted data. More specifically, for example, in a case of performing building by additive manufacturing, data indicating the entire object is used as input data before conversion, and slice processing is performed on the input data to be converted into a plurality of pieces of slice data (to generate a plurality of pieces of slice data). In this case, as the pieces of slice data, it can be considered to use pieces of data indicating a cross section of the object at positions different from each other in a predetermined deposition direction. For example, the slice data can be considered to be data indicating a layer of the ink to be formed at a position of each cross section. For example, the slice data can also be considered to be a two-dimensional image (2D image data) indicating a cross section. In this case, the building apparatus ejects ink in accordance with each piece of slice data to form a layer of the ink corresponding to each piece of the slice data. By overlapping a plurality of layers of the ink corresponding to a plurality of pieces of slice data to be formed, the object is built.

Processing of generating the slice data is processing of performing a large number of pieces of image processing and the like, so that it may take much time for the processing. Thus, if formation of the layer of the ink (building output) is started after all pieces of the slice data corresponding to the entire object are completely generated, waiting time until the layer of the ink is started to be formed may become excessively long. Thus, in this case, processing of generating the slice data and an operation of forming the layer of the ink may be performed in parallel. In this case, by starting to form the layer of the ink at a time when the first piece of slice data is generated, for example, waiting time until the layer of the ink is started to be formed can be shortened.

However, when the inventor of the present disclosure performed an experiment of actually building an object, the inventor found that, in a case of performing the processing of generating the slice data and the operation of forming the layer of the ink in parallel as described above, an unintended conspicuous streak (deposition streak) was generated in the object in some cases. In this case, quality of the object is deteriorated due to an effect of the conspicuous streak, and quality required for building cannot be achieved in some cases. Thus, the present disclosure provides a building apparatus and a building method for solving the above problem.

The inventor of the present disclosure has made vigorous investigation as to a cause of the unintended conspicuous streak that is generated in a case of performing the processing of generating the slice data and the operation of forming the layer of the ink in parallel. The inventor then found that a position at which such a streak is generated is a position corresponding to a timing at which the processing of generating the slice data cannot catch up with the parallel operation.

More specifically, in a case of building the object through the parallel operation as described above, the slice data corresponding to each layer of the ink needs to be completely generated by the time at least when the layer of the ink is started to be formed. Thus, in a case in which the slice data corresponding to the next layer of the ink is not completely generated at the time when a previous layer of the ink is completely formed, the next layer of the ink cannot be formed until the slice data is completely generated, so that extra waiting time is generated. In this case, a state of the layer of the ink formed before or after the waiting time is affected by the extra waiting time, and an unintended conspicuous streak may be caused.

To prevent such a problem from being caused, the inventor of the present disclosure has considered to start to form the first layer of the ink after generating a certain number of pieces of slice data instead of starting to form the first layer of the ink immediately after the first piece of slice data is generated. Also in this case, the inventor of the present disclosure has focused on idle time (interlayer time) in a period in which successive two layers of the ink are formed, and considered to control the time to be equal to or smaller than a predetermined upper limit value. With this configuration, for example, excessive waiting time can be appropriately prevented from being generated in a period in which successive two layers of the ink are formed. Accordingly, an unintended conspicuous streak can be appropriately prevented from being generated due to an effect of the waiting time.

The inventor of the present disclosure found a characteristic required for obtaining such an effect through further vigorous investigation, and made the present disclosure. To solve the above problem, the present disclosure provides a building apparatus for building an object by depositing a material layer as a layer of a material of the object in a deposition direction set in advance, the building apparatus including: a head, configured to eject the material of the object; a data generation unit, configured to generate ejection position designating data as data indicating a position at which the head ejects the material of the object; and a control unit, configured to control an operation of the head and an operation of the data generation unit, wherein the data generation unit generates the ejection position designating data based on input data indicating the object in a format different from a format of the ejection position designating data, and in a case in which an idle time after a lower material layer of two material layers that are successively overlapped in the deposition direction is formed until an upper material layer thereof is started to be formed is defined as an interlayer time, during a time when the data generation unit performs an operation of generating the ejection position data in at least a part of a period of building the object, the control unit causes the head to form a plurality of material layers constituting at least a part of the object, and sets a layer forming start timing as a timing for starting to form the material layers so that the interlayer time does not exceed an upper limit time set in advance during a time when the material layers are being formed.

With this configuration, for example, the interlayer time can be caused to be equal to or smaller than a predetermined upper limit time. Due to this, for example, an unintended conspicuous streak can be prevented from being generated, and a high quality object can be appropriately built.

In this configuration, for example, the upper limit time may be set, depending on required quality for building and the like, in a range in which an unintended conspicuous streak and the like are not generated due to an effect of the interlayer time. As the material of the object, for example, known ink and the like used for a building apparatus can be preferably used. In this case, the material layer is the layer of the ink. The data generation unit generates, for example, a plurality of pieces of slice data as ejection position designating data. As a plurality of pieces of slice data, for example, the data generation unit generates a plurality of pieces of data indicating respective cross sections of the object at positions different from each other in the deposition direction. In this case, the control unit causes the head to form the material layers constituting the object based on the respective pieces of slice data. With this configuration, for example, the object can be appropriately built by additive manufacturing. In this case, the control unit preferably sets the layer forming start timing so that, before each material layer of the plurality of material layers is started to be formed, the slice data corresponding to the material layer is completely generated. With this configuration, for example, extra waiting time can be appropriately prevented from being generated when generation of the slice data cannot catch up with the processing.

In this configuration, for example, the building apparatus may further include a scanning driver that causes the head to perform a main scanning operation. In this case, the main scanning operation means, for example, an operation of ejecting a building material while moving relatively to the object in a main scanning direction set in advance. In this case, for example, the control unit sets the layer forming start timing so that, for successive two main scanning operations, a time after a previous main scanning operation is completed until a subsequent main scanning operation is started does not exceeds the upper limit time. With this configuration, for example, the interlayer time can be appropriately prevented from exceeding the upper limit time.

In this configuration, as the material of the object, for example, a material to be cured by being irradiated with ultraviolet rays (UV curable ink and the like) can be preferably used. In this case, for example, the head includes an ejection head that ejects the building material, and a UV light source. In this case, for example, the UV light source emits ultraviolet rays to the building material ejected by the ejection head to cure the building material. In this case, at the time of forming a lower material layer, the UV light source cures the building material constituting the lower material layer so that, for example, at least until the next material layer is started to be formed, at least an upper surface of the lower material layer has adhesiveness. With this configuration, for example, adhesiveness between the material layers constituting the object can be appropriately enhanced. Preferably, the head further includes a flattening module for flattening the material layer. For example, the flattening module is brought into contact with the building material before curing (uncured) to flatten the material layer. As the flattening module, for example, a roller that scrapes off part of the building material before curing can be preferably used. With this configuration, for example, each material layer can be appropriately formed.

As described above, to appropriately prevent the interlayer time from exceeding the upper limit time, for example, the first material layer may be started to be formed after a certain number of pieces of slice data are generated. In this case, from a simple consideration, it may be sufficient that the first material layer is started to be formed at the time when a certain number of pieces of slice data set in advance are generated. However, the building apparatus may build objects having various shapes or colors. For example, in a case of generating the slice data based on the input data, time required for generating the slice data may typically greatly vary depending on a shape, a color, and the like of the object. In such a case, the first material layer is started to be formed simply after generating a certain number of pieces of slice data, generation of the slice data cannot catch up with the processing in some cases depending on a shape and the like of the object. In this case, to securely prevent generation of the slice data from being unable to catch up with the processing, a large number of pieces of slice data should be generated in advance, so that start of formation of the material layer may be late more than necessary depending on a shape and the like. As a result, time required for building may be increased, for example.

Thus, to more appropriately shorten the time required for building, the layer forming start timing is preferably set individually in consideration of a shape, a color, and the like of the object. In this case, for example, the control unit may set the layer forming start timing based on the input data so that the interlayer time does not exceed the upper limit time during a time when the plurality of material layers are being formed. More specifically, in this case, for example, the data generation unit generates respective pieces of slice data in order from a piece of slice data corresponding to the lower material layer in the deposition direction. For example, the control unit determines, based on the input data, a number of pieces of preparation data as a number of pieces of slice data to be generated before the layer forming start timing. The control unit then sets the layer forming start timing so that the plurality of material layers are started to be formed after the pieces of slice data corresponding to the number of pieces of preparation data are completely generated. With this configuration, for example, the layer forming start timing can be individually and appropriately set corresponding to a characteristic of the object. Accordingly, extra waiting time can be appropriately prevented from being generated when generation of the slice data cannot catch up with the processing, and the time required for building can be appropriately shortened.

Depending on the quality required for building, for example, it is more important to further shorten the time required for building than to prevent an unintended conspicuous streak and the like from being generated. In such a case, it is more preferable to start to form the material layer at a timing as early as possible rather than to set the layer forming start timing based on the input data. Thus, in the building apparatus, the control unit may determine whether to adjust the layer forming start timing based on an instruction from a user. For example, in a case of determining to adjust the layer forming start timing, the control unit sets the layer forming start timing so as to prevent an unintended conspicuous streak and the like from being generated. In this case, for example, the control unit sets the layer forming start timing so that the interlayer time does not exceeds the upper limit time during a time when the plurality of material layers are being formed. In a case of determining not to adjust the layer forming start timing, the control unit sets the layer forming start timing so as to start to form the material layer as early as possible. In this case, for example, the control unit sets, as the layer forming start timing, a timing matched with a timing at which the data generation unit starts to generate the ejection position data. With this configuration, for example, the object can be built more appropriately depending on the quality and the like required for building.

As a configuration of the present disclosure, a building method and the like having the same characteristic as that described above may be used. Also in this case, for example, the same effect as that described above can be obtained. For example, this building method can be considered to be a method of manufacturing the object.

According to the present disclosure, for example, a high quality object can be appropriately built.

BRIEF DESCRIPTION OF THE DRAWINGS

FIG. 1 including FIG. 1A illustrates an example of a configuration of the building system 10. FIG. 1B illustrates an example of a configuration of a principal part of a building apparatus 12.

FIG. 3 including FIG. 3A illustrates an example of an operation in a case of starting the building operation after slice data is completely generated. FIG. 3B illustrates an example of an operation in a case of performing the building operation in parallel with processing of generating the slice data.

DESCRIPTION OF EMBODIMENTS

Figure 1A:
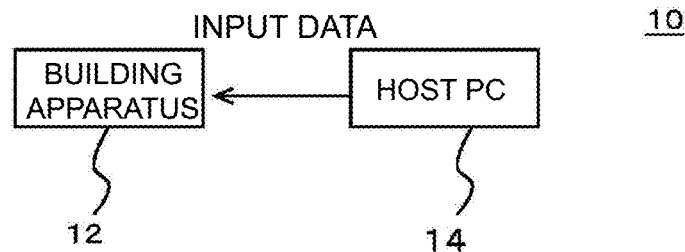
FIG. 1A and FIG. 1B, are diagrams illustrating an example of a building system 10 according to an embodiment of the present disclosure.

The following describes an embodiment according to the present disclosure with reference to the drawings. FIG. 1 illustrates an example of a building system 10 according to an embodiment of the present disclosure. FIG. 1A illustrates an example of a configuration of the building system 10. In the present embodiment, the building system 10 is a building system that builds a three-dimensional (3D) object, and includes a building apparatus 12 and a host PC 14.

The building apparatus 12 is an apparatus that builds an object (3D printer), and builds an object 50 based on input data received from the host PC 14. In this case, the object 50 is, for example, a three-dimensional structure. The input data is, for example, data indicating the object 50 to be built by the building apparatus 12. In the present embodiment, the input data is data made through layout work performed by the host PC 14, and indicates the object 50 in a state in which an arrangement, a direction, and the like of the object 50 at a time of building are designated. For example, "indicates the object 50 in a state in which an arrangement, a direction, and the like are designated" means "indicates the object 50 in a state of reflecting an arrangement and a direction designated by a user of the building system 10".

More specifically, in the present embodiment, the building apparatus 12 is a full-color building apparatus that can build a full-colored object, and builds the object 50 at least a surface of which is colored based on the input data received from the host PC 14. For example, "the surface of the object 50 is colored" means that at least part of a region of the object 50 a color of which can be visually recognized from the outside is colored. The object 50 at least the surface of which is colored can be considered to be, for example, the object 50 at least a part of the surface of which is colored.

The building apparatus 12 builds the object 50 by additive manufacturing by depositing a material layer as a layer of a material of the object in a deposition direction set in advance. The additive manufacturing can be considered to be, for example, a method of building the object 50 by overlapping a plurality of layers. In this case, the building apparatus 12 generates a plurality of pieces of slice data based on the input data, and forms the layers constituting the object 50 in accordance with the respective pieces of slice data. As a plurality of pieces of slice data, generated are pieces of data indicating respective cross sections of the object 50 at positions different from each other in the deposition direction. In this case, each piece of the slice data can be considered to be, for example, data of an image indicating a cross section of the object at each position (cross section image data).

In the present embodiment, a plurality of pieces of slice data are an example of ejection position designating data. In this case, the ejection position designating data means, for example, data indicating a position at which the material of the object 50 is ejected by a head of the building apparatus 12. The head is a configuration of ejecting the material of the object 50 in the building apparatus 12. In this case, the input data can be considered to be, for example, data indicating the object 50 in a format different from that of the ejection position designating data.

The host PC 14 is a computer arranged outside the building apparatus 12, and sets a building condition in response to an operation by a user, for example. In this case, the building condition means, for example, a condition designated for building the object 50 in the building apparatus 12. More specifically, in the present embodiment, the host PC 14 performs layout work and the like as an operation of setting the building condition. The layout work means, for example, work for designating an arrangement or a direction of the object 50 at the time of building. The host PC 14 receives, from the outside, object data as data indicating the object 50 to be built, and adjusts the arrangement or direction of the object 50 indicated by the object data in response to an instruction from the user to generate the input data. In this case, for example, the object data can be considered to be, for example, data indicating the object 50 in a state before layout is performed. The input data can be considered to be, for example, data indicating the object 50 in a state after layout is performed. In this case, "indicating the object 50 in a state after layout is performed" means, for example, indicating the object 50 in a designated direction and arrangement. The object data may be, for example, generated by the host PC 14 in response to an operation and the like of the user instead of being received from the outside of the host PC 14. In the building apparatus 12, for example, a plurality of objects 50 may be built at the same time. In this case, in layout work in the host PC 14, a direction, an arrangement, and the like are designated for a plurality of objects 50 to be built at the same time.

After the user completes the layout work, the host PC 14 transmits the generated input data to the building apparatus 12 via a network, for example. In this case, the input data can be considered to be, for example, data of a building job to be transmitted to the building apparatus 12. As described above, in the present embodiment, the building apparatus 12 does not directly perform the building operation in accordance with the input data, but generates a plurality of pieces of slice data based on the input data to perform the building operation based on the pieces of slice data. In this case, as the input data, for example, data independent of a device type and the like of the building apparatus 12 (for example, general-purpose 3D data) can be preferably used.

Figure 1B:
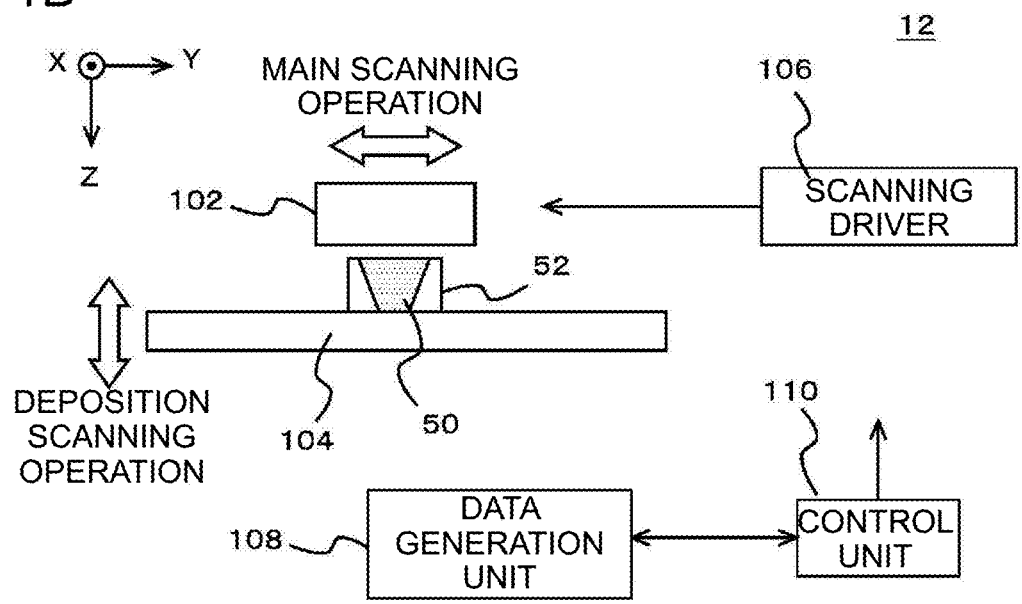

Subsequently, the following describes a specific configuration of the building apparatus 12. FIG. 1B illustrates an example of a configuration of a principal part of the building apparatus 12. In the present embodiment, the building apparatus 12 is a building apparatus for building the three-dimensional object 50, and includes a head 102, a stage 104, a scanning driver 106, a data generation unit 108, and a control unit 110.

Except the points described below, the building apparatus 12 may have a configuration that is the same as or similar to that of a known building apparatus. More specifically, except the points described below, the building apparatus 12 may have a configuration that is the same as or similar to that of a known building apparatus that performs building by ejecting droplets as a material of the object 50 using an inkjet head. In addition to the illustrated configuration, for example, the building apparatus 12 may further include various configurations required for building the object 50.

The head 102 is a portion that ejects the material (building material) of the object 50. In the present embodiment, ink is used as the material of the object 50. In this case, the ink means, for example, a functional liquid. In the present embodiment, the ink can be considered to be, for example, a liquid ejected from the inkjet head. More specifically, as the material of the object 50, the head 102 ejects ink to be cured in accordance with a predetermined condition through a plurality of inkjet heads. By curing the ink after landing, the respective layers constituting the object 50 are overlapped to be formed, and the object is built by additive manufacturing. In this case, each layer of the ink can be considered to be an example of the material layer constituting the object 50. In the present embodiment, as the ink, used is UV curable ink (UV ink) to be cured from a liquid state by being irradiated with ultraviolet rays. The head 102 further ejects a material of a support layer 52 in addition to the material of the object 50. Due to this, the head 102 forms the support layer 52 as needed around the object 50. The support layer 52 means, for example, a deposition structure that supports the object 50 by surrounding an outer circumference of the object 50 being built. The support layer 52 is formed as needed at the time of building the object 50, and removed after the building is completed.

The stage 104 is a table-like member that supports the object 50 being built, arranged at a position opposed to the inkjet head of the head 102, and has an upper surface on which the object 50 being built is placed. In the present embodiment, the stage 104 has a configuration in which at least the upper surface thereof is movable in the deposition direction (Z-direction in the drawing), and moves at least the upper surface following progress of building of the object 50 by being driven by the scanning driver 106. In the present embodiment, the deposition direction is a direction orthogonal to a main scanning direction (Y-direction in the drawing) and a sub scanning direction (X-direction in the drawing) set in advance in the building apparatus 12.

The scanning driver 106 is a driver that causes the head 102 to perform a scanning operation of moving relatively to the object 50 being built. In this case, "moving relatively to the object 50 being built" means, for example, moving relatively to the stage 104. For example, "causes the head 102 to perform a scanning operation" means to cause the inkjet head included in the head 102 to perform the scanning operation. In the present embodiment, the scanning driver 106 causes the head 102 to perform a main scanning operation (Y-scanning), a sub scanning operation (X-scanning), and deposition scanning operation (Z-scanning).

In this case, the main scanning operation means, for example, an operation of ejecting the ink while moving in the main scanning direction relatively to the object 50 being built. The sub scanning operation means, for example, an operation of moving relatively to the object 50 being built in the sub scanning direction orthogonal to the main scanning direction. The sub scanning operation can be considered to be, for example, an operation of moving relatively to the stage 104 in the sub scanning direction by a feeding amount set in advance. The deposition scanning operation means, for example, an operation of moving the head 102 in the deposition direction relatively to the object 50 being built. The scanning driver 106 causes the head 102 to perform the deposition scanning operation in accordance with progress of the building operation to adjust a relative position of the inkjet head to the object 50 being built in the deposition direction.

The data generation unit 108 is a processor that generates a plurality of pieces of slice data based on the input data. In this case, for example, the data generation unit 108 performs slice processing on the object 50 indicated by the input data to generate a plurality of pieces of slice data. In this case, as each piece of the slice data, for example, generated is data of a raster image indicating a cross section of the object 50 at each position. In the present embodiment, the head 102 ejects ink of various colors to be used for building based on the pieces of slice data. Due to this, based on each piece of the slice data, the head 102 forms the layer of the ink constituting a cross section corresponding to the piece of slice data. Thus, for example, the slice data can be considered to be data designating a position at which the ink of various colors to be used for building is ejected. In the present embodiment, the slice data further indicates a cross section of the support layer 52 formed around the object 50. In this case, for example, the layer of the ink constituting the cross section corresponding to the slice data can be considered to be the layer of the ink constituting the object 50 and the support layer 52.

As described above, in the present embodiment, the object 50 is built while the support layer 52 is formed as needed. In this case, for example, a position at which the support layer 52 is formed may be set in the layout work performed by the host PC 14. In this case, for example, the position at which the support layer 52 is formed may be automatically set corresponding to a direction or an arrangement of the object 50. Additionally, the position at which the support layer 52 is formed may be set at a time of generating the slice data, for example. Also in this case, setting may be automatically performed corresponding to a direction, an arrangement, and the like of the object 50.

In the operation of generating the slice data, for example, the data generation unit 108 at least performs a raster image processor (RIP) processing of generating data of a raster image corresponding to a resolution of building. The processing of generating the slice data can be considered to be a processing of converting the input data into output data of a predetermined format. In this case, as the output data of a predetermined format, for example, data of a format depending on a device type of the building apparatus 12 may be used, the format indicating each cross section of the object 50. For example, the data generation unit 108 may generate the slice data in the same or similar manner as known processing for generating the slice data.

The control unit 110 is, for example, a CPU of the building apparatus 12, and controls each unit of the building apparatus 12 to control the building operation and the like of the object 50. In this case, for example, the building operation means an operation of forming the layer of the ink constituting the object 50 by ejecting the ink from the head 102. In the present embodiment, the control unit 110 controls each unit of the building apparatus 12 based on the slice data generated by the data generation unit 108. In this case, for example, the control unit 110 controls an operation of the inkjet head of the head 102 to cause the inkjet head to eject the ink to be used for building the object. With this configuration, for example, the building operation by additive manufacturing can be appropriately performed.

In the present embodiment, the building apparatus 12 is configured to be able to perform the building operation in parallel with the processing of generating the slice data. In this case, in at least a part of a period of building the object 50, during a time when the data generation unit 108 performs the operation of generating a plurality of pieces of slice data, the control unit 110 causes the head 102 to form a plurality of layers of the ink constituting at least a part of the object 50. For example, the operation of performing the building operation in parallel with the processing of generating the slice data can be considered to be an operation of starting the building operation before the data generation unit 108 completely generates all the pieces of the slice data. In the present embodiment, the control unit 110 determines a timing for starting the building operation based on the input data, and starts the building operation at the timing. A characteristic of performing the building operation in parallel with the processing of generating the slice data will be described later in more detail.

Figure 1C:
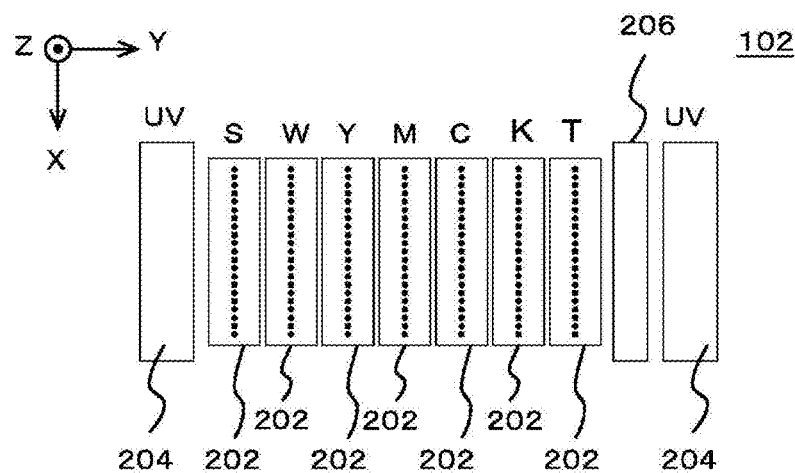
FIG. 1C illustrates an example of a configuration of a head 102.

The following describes a configuration of the head 102 according to the present embodiment in more detail. FIG. 1C illustrates an example of the configuration of the head 102. In the present embodiment, the head 102 includes a plurality of inkjet heads 202, a plurality of UV light sources 204, and a flattening roller 206. As the inkjet heads 202, the head 102 includes at least inkjet heads for a material of the support layer 52 (S), for white ink (W), for coloring, and for clear ink (T). In this case, the material of the support layer 52 means the ink used as the material of the support layer 52 (support material). The white ink is, for example, ink for forming a region used as a light-reflective region in the object 50. The ink for coloring means ink for each of a plurality of colors used for coloring. More specifically, as the ink for coloring, for example, used is ink of various colors, that is, a yellow color (Y color), a magenta color (M color), a cyan color (C color), and a black color (K color). The clear ink means, for example, ink of a clear color, that is, a colorless transparent color (T). The inkjet heads are arranged, for example, side by side in the main scanning direction while positions thereof in the sub scanning direction are aligned.

The UV light sources 204 are light sources (UV light sources) for curing the ink, and irradiates the ink ejected by each of the inkjet heads 202 with ultraviolet rays to cure the ink. The respective UV light sources 204 are arranged, for example, on one end side and the other end side in the main scanning direction of the head 102 to hold an alignment of the inkjet heads 202 therebetween. As the UV light source 204, for example, an ultraviolet LED (UVLED) and the like can be preferably used. As the UV light source 204, a metal halide lamp, a mercury lamp, and the like may be used. The flattening roller 206 is an example of a flattening module for flattening the layer of the ink that is formed during a time when the object 50 is being built. For example, in the main scanning operation, the flattening roller 206 is brought into contact with a surface of the layer of the ink, and brought into contact with the ink before curing. By removing a part of the ink before curing, the layer of the ink is flattened. In this case, for example, the operation of the flattening roller 206 can be considered to be an operation of scraping off a part of the ink before curing. By using the head 102 having the configuration as described above, the layer of the ink constituting the object 50 can be appropriately formed. By overlapping a plurality of layers of the ink to be formed, the object 50 can be appropriately built.

A specific configuration of the head 102 is not limited to the configuration described above, and can be variously modified. For example, the head 102 may further include, as the inkjet head for coloring, an inkjet head for a color other than the colors described above. An arrangement of the inkjet heads of the head 102 can also be variously modified. For example, positions of some of the inkjet heads may be shifted from the positions of the other inkjet heads in the sub scanning direction. The data generation unit 108 is not necessarily arranged as a configuration separated from the control unit 110, but the control unit 110 may also function as the data generation unit 108. In this case, in the processing of generating a plurality of pieces of the slice data performed by the control unit 110, it can be considered that the control unit 110 operates as the data generation unit 108.

Figure 2:
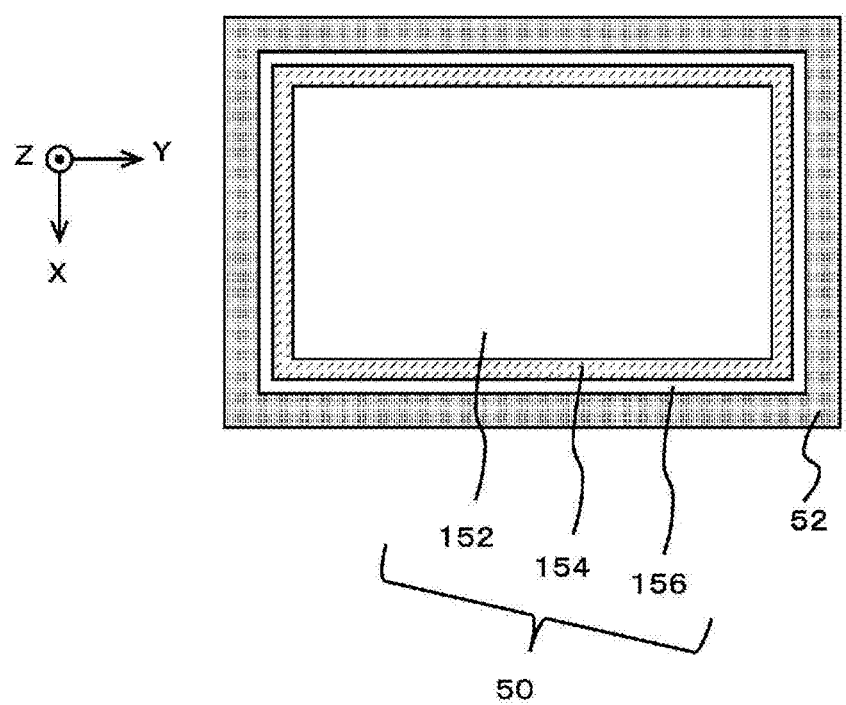
FIG. 2 is a diagram illustrating an example of an object 50 built by the building apparatus 12 according to the present embodiment.

Subsequently, the following describes the configuration of the object 50 built by the building apparatus 12 according to the present embodiment in more detail. FIG. 2 is a diagram illustrating an example of the object 50 built by the building apparatus 12 according to the present embodiment, and illustrates, together with the support layer 52, an example of a configuration of an X-Y cross section as a cross section of the object 50 orthogonal to the deposition direction (Z-direction). In this case, a Z-X cross section and a Z-Y cross section of the object 50 orthogonal to the Y-direction and the Z-direction have a similar configuration.

As described above, in the present embodiment, the building apparatus 12 builds the object 50 at least the surface of which is colored. More specifically, in this case, the building apparatus 12 builds the object 50 including an interior region 152, a colored region 154, and a protective region 156 as illustrated in the drawing, for example. As needed, the support layer 52 is formed around the object 50, for example.

The interior region 152 is a region constituting an interior of the object 50. The interior region 152 can be considered to be a region constituting a shape of the object 50, for example. In the present embodiment, the interior region 152 is formed with white ink to be a region also serving as a light-reflective region. In this case, the light-reflective region means, for example, a light-reflective region for reflecting light entered from the outside of the object 50 via the colored region 154 and the like.

The colored region 154 is a region to be colored by being formed with the ink for coloring. In the present embodiment, the building apparatus 12 ejects the ink for coloring of the respective colors and the clear ink from the inkjet heads of the head 102 to form the colored region 154 around the interior region 152. In this case, for example, by adjusting an ejection amount of the ink for coloring of each color to each position, various colors are expressed. To compensate variation in an amount of the ink for coloring caused by difference in color to be a certain amount, the clear ink is used. With this configuration, for example, each position of the colored region 154 can be appropriately colored with a desired color.

The protective region 156 is a transparent region for protecting an outer face of the object 50. In the present embodiment, the building apparatus 12 forms the protective region 156 around the colored region 154 using the clear ink. Due to this, the head 102 forms the protective region 156 to cover an outer side of the colored region 154 using a transparent material. By forming each region as described above, the object 50 the surface of which is colored can be appropriately formed.

In a modification of the configuration of the object 50, the specific configuration of the object 50 can be different from that described above. In this case, for example, a light-reflective region may be formed between the interior region 152 and the colored region 154 separately from the interior region 152 instead of forming the interior region 152 also serving as the light-reflective region. In this case, the interior region 152 can be formed using optional ink other than the support material. Some of the regions in the object 50 may be omitted, for example. A region other than the regions described above may be further formed in the object 50.

Subsequently, the following describes a timing at which the building operation is performed in the present embodiment in more detail. FIG. 3 illustrates various examples of the timing at which the building operation is performed. As described above, in the present embodiment, the building apparatus 12 generates a plurality of pieces of slice data, and forms the layer of the ink in accordance with each piece of the slice data. In this case, it is at least necessary to generate, before each layer of the ink is started to be formed, the slice data corresponding to the layer.

Figure 3A:
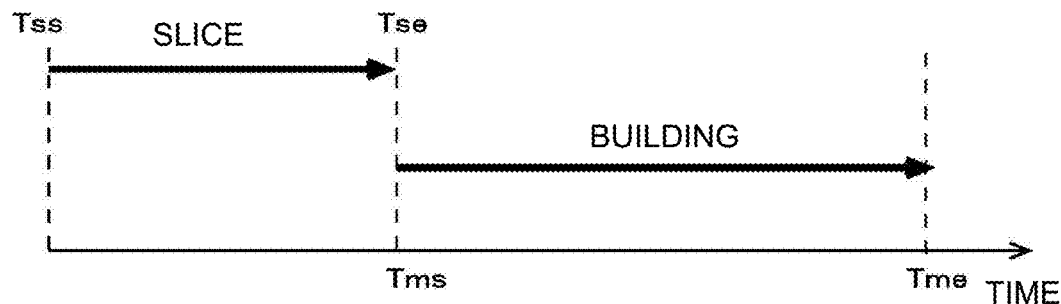
FIG. 3A and FIG. 3B, are diagrams for explaining a timing at which a building operation is performed.

Considering a case of generating each piece of the slice data before each layer of the ink is formed, it can be most simply considered to perform the building operation as illustrated in FIG. 3A, for example. FIG. 3A illustrates an example of an operation in a case of starting the building operation after the slice data is completely generated. For example, the operation illustrated in FIG. 3A can be considered to be an operation of performing building after the RIP processing for generating the slice data (post-RIP building operation).

More specifically, in this case, a timing Tss illustrated in the drawing is a timing for starting to generate the slice data. A timing Tse is a timing at which the slice data is completely generated. A timing Tms is a timing for starting the building operation. In the present embodiment, the timing Tms for starting the building operation is an example of the layer forming start timing as a timing for starting to form the layer of the ink. A timing Tme is a timing at which the building operation is completed. In the operation illustrated in FIG. 3A, the building operation is started at the timing Tms after the timing Tse at which all the pieces of the slice data are completely generated. In a case of such a configuration, each layer of the ink is formed in a state in which all the pieces of slice data are generated. Thus, at the timing for forming each layer of the ink, a corresponding piece of slice data has been certainly generated.

However, it takes much time to generate the slice data in some cases. Thus, in a case of generating the slice data or performing the building operation as illustrated in FIG. 3A, the timing Tms for starting the building operation may be delayed, and a time until the timing Tme at which the building operation is completed may be prolonged. As a result, it may become difficult to efficiently build the object 50.

Figure 3B:
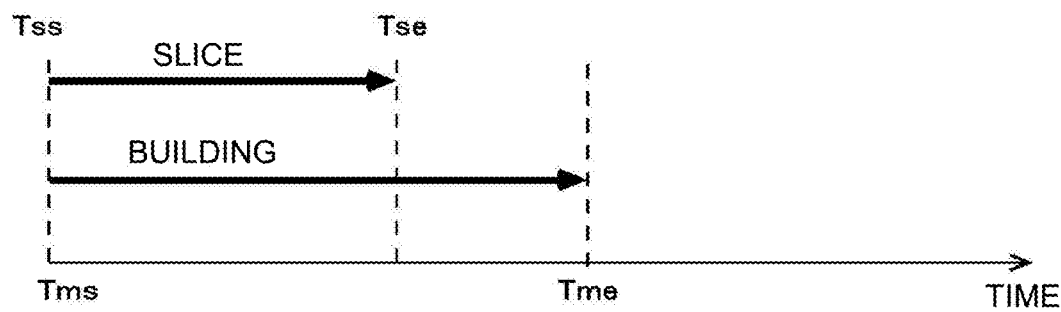

To build the object 50 more efficiently, as described above, the building operation may be performed in parallel with the processing of generating the slice data, for example. FIG. 3B illustrates an example of an operation in a case of performing the building operation in parallel with the processing of generating the slice data. For example, the operation illustrated in FIG. 3B can be considered to be an operation of performing building and the RIP processing for generating the slice data at the same time (RIP & building operation).

In this case, as illustrated in the drawing, for example, the timing Tss for starting to generate the slice data is matched with the timing Tms for starting the building operation. For example, "the timing Tss for starting to generate the slice data is matched with the timing Tms for starting the building operation" means to start the building operation at the timing when a first piece of slice data is generated. For example, "the timing Tss for starting to generate the slice data is matched with the timing Tms for starting the building operation" may be a case in which the timing Tss is substantially matched with the timing Tms in consideration of processing and the like required for starting each operation. In a case of such a configuration, the time until the timing Tme at which the building operation is completed can be shortened as compared with the case illustrated in FIG. 3A, for example. Due to this, for example, the object 50 can be built more efficiently.

However, as described above, it takes much time to generate the slice data in some cases. Depending on the shape or color of the object 50 to be built, a time required for generating the slice data may be longer than a substantial building time. In this case, the substantial building time means, for example, a time excluding a period in which the building operation is temporarily stopped (described later in detail) from a time from the timing Tms for starting the building operation until the timing Tme at which the building operation is completed.

Figure 3C:
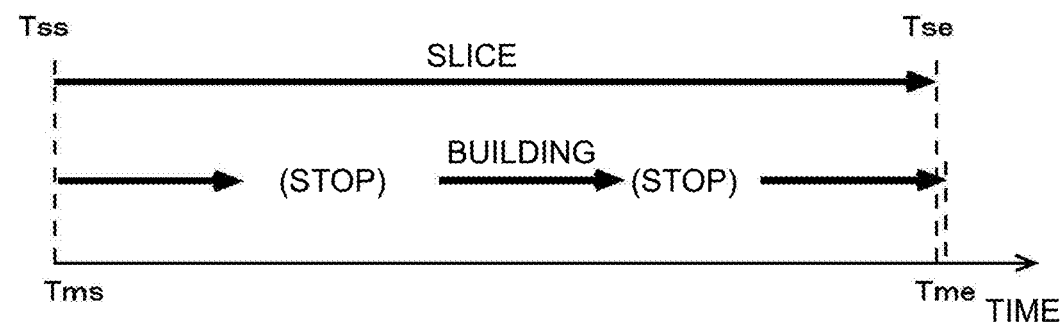
FIG. 3C illustrates an example of an operation in a case in which a time required for generating the slice data is longer than a substantial building time.

FIG. 3C illustrates an example of an operation in a case in which the time required for generating the slice data is longer than the substantial building time. In this case, for example, it takes time to generate each piece of the slice data, so that, in the middle of the building operation, generation of a piece of slice data corresponding to the layer of the ink to be formed next cannot catch up with the operation in some cases. In this case, for example, the building operation needs to be temporarily stopped to wait for generation of the slice data. FIG. 3C illustrates a timing for stopping the building operation in a simplified manner.

At the time of actual building, for example, generation of the slice data cannot catch up with the operation every time a certain number of layers of the ink are formed, and the building operation may be temporarily stopped.

In such a case, the timing Tme at which the building operation is completed is a timing at which at least one layer of the ink is formed after the timing Tse at which all the pieces of slice data are completely generated. Thus, a time from the timing Tms for starting the building operation until the timing Tme at which the building operation is completed becomes longer than the substantial building time. In this case, when the building operation is temporarily stopped, the quality of the object 50 may be affected. More specifically, in a case of temporarily stopping the building operation, an extra waiting time is generated before the next layer of the ink is started to be formed as compared with a case in which the building operation is not stopped. In this case, a state of the layer of the ink formed before or after the waiting time is affected by the extra waiting time, and an unintended conspicuous streak may be generated. Thus, depending on the quality required for the object 50, it is not preferable to temporarily stop the building operation as described above in some cases.

Figure 3D:
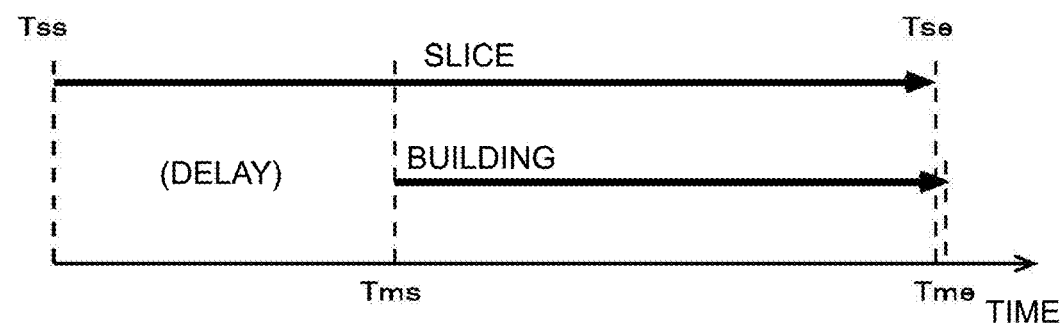
FIG. 3D illustrates an example of an operation in a case of delaying a timing Tms for starting the building operation.

In the present embodiment, by starting the building operation after a certain time has elapsed after the slice data is started to be generated instead of matching the timing Tss for starting to generate the slice data with the timing Tms for starting the building operation, the building operation is prevented from being temporarily stopped due to delay of generation of the slice data while performing generation of the slice data and the building operation in parallel in at least a partial period. FIG. 3D illustrates an example of the operation in a case of delaying the timing Tms for starting the building operation. In this case, by delaying the timing Tms for starting the building operation with respect to the timing Tss for starting to generate the slice data, the building operation is started at a time when generation of the slice data progresses to some degree. After the timing Tms for starting the building operation, the building operation is performed in parallel with the processing of generating the slice data.

An effect on building quality caused by a temporary stop of the building operation may be, for example, increased as a stopping time is prolonged. Thus, the timing Tms for starting the building operation may be set so that a time of temporary stop of the building operation becomes an upper limit time set in advance, for example. The upper limit time may be, for example, set in a range in which an unintended conspicuous streak and the like as a problem of required building quality and the like are not generated. In this case, the control unit 110 (refer to FIG. 1) in the building apparatus 12 preferably sets the timing Tms for starting the building operation so that, before each layer of the ink constituting the object 50 is started to be formed, the slice data corresponding to the layer of the ink is completely generated. With this configuration, for example, the extra waiting time can be appropriately prevented from being generated due to delay of generation of the slice data.

Focusing on the interlayer time as an idle time in a period in which successive overlapped two layers of the ink are formed in the deposition direction among a plurality of layers of the ink constituting the object 50, for example, the operation illustrated in FIG. 3D can be considered to be an operation of setting the timing Tms for starting the building operation so that an interlayer time does not exceed the upper limit time set in advance during a time when the layers of the ink constituting the object 50 are being formed. In this case, more specifically, for example, the interlayer time can be considered to be an idle time after a lower layer of the ink of the successive two layers of the ink overlapped in the deposition direction is formed until an upper layer of the ink is started to be formed. With this configuration, for example, by causing the interlayer time to be equal to or smaller than a predetermined upper limit time of the interlayer time, an unintended conspicuous streak can be prevented from being generated, and the high quality object 50 can be appropriately built. In this case, for example, the upper limit time of the interlayer time is preferably set corresponding to the interlayer time that is generated even when the extra waiting time as described above is not generated. More specifically, in this case, for example, as the upper limit time of the interlayer time, it can be considered to set a time obtained by adding a predetermined margin to a time required for deposition scanning operation and the like that is performed during a period of forming the successive two layers of the ink.

As described above, in the present embodiment, the building apparatus 12 causes the head 102 (refer to FIG. 1) to perform the main scanning operation in the operation of forming each layer of the ink. Thus, the upper limit time of a time in which the building operation is temporarily stopped can be considered in relation to an idle time between successive two main scanning operations. In this case, for example, the control unit 110 of the building apparatus 12 sets the timing Tms for starting the building operation so that, regarding successive two main scanning operations performed at the time of building the object 50, a time after a previous main scanning operation is completed until a subsequent main scanning operation is started does not exceed the upper limit time set in advance. With this configuration, for example, the interlayer time can be appropriately prevented from exceeding the upper limit time.

As described above, in a case of delaying the timing Tms for starting the building operation with respect to the timing Tss for starting to generate the slice data, the first layer of the ink is started to be formed after a certain number of pieces of slice data are generated by the data generation unit 108. In this case, it can be simply considered to set the timing Tms for starting the building operation to be a point at which a certain number of pieces of slice data set in advance are generated.

However, the building apparatus 12 may build objects of various shapes and colors. For example, in a case of generating the slice data based on the input data, typically, the time required for generating the slice data may greatly vary depending on a shape, a color, and the like of the object 50. More specifically, for example, the time required for generating the slice data may be different by ten times or more between a case of building the object 50 having a simple shape and color and a case of building the object 50 having a complex shape and color. In such a case, to start to form the first layer of the ink simply after generating a certain number of pieces of slice data, a plenty of pieces of slice data needs to be generated in advance so that the building operation is not temporarily stopped even when it takes time to generate the slice data. In this case, depending on the shape and the like of the object 50, the building operation is started after a large number of pieces of slice data more than necessary are formed, so that the timing Tms for starting the building operation may be excessively delayed. As a result, the timing Tme at which the building operation is completed is greatly delayed.

The number of layers of the ink formed at the time of building the object 50 typically varies depending on a height and the like of the object 50 in the deposition direction. Thus, the time from the timing Tms for starting the building operation to the timing Tme at which the building operation is completed typically vary for each object 50. In this case, the number of pieces of slice data to be formed by the time when the building operation is started also varies depending on the shape and the like of the object 50.

Thus, to more appropriately shorten the time required for building, it is preferable to individually set the timing Tms for starting the building operation in consideration of the shape, the color, and the like of the object 50. In this case, for example, the timing Tms for starting the building operation may be set based on the input data received from the host PC 14 (refer to FIG. 1). In this case, the control unit 110 of the building apparatus 12 sets the timing Tms for starting the building operation based on the input data so that the interlayer time does not exceed the upper limit time during a time when a plurality of layers of the ink constituting the object 50 are being formed. More specifically, in this case, for example, the data generation unit 108 generates the pieces of slice data in order from a piece of slice data corresponding to the lower layer of the ink in the deposition direction. For example, the control unit 110 determines, based on the input data, a number of pieces of preparation data that is the number of pieces of slice data to be generated before the timing Tms for starting the building operation. The timing Tms for starting the building operation is set so that a plurality of layers of the ink constituting the object 50 are started to be formed after the pieces of slice data corresponding to the number of pieces of preparation data are completely generated. With this configuration, for example, the timing Tms for starting the building operation can be individually and appropriately set in accordance with the characteristic of the object 50.

As described above, according to the present embodiment, for example, by performing the building operation as illustrated in FIG. 3D, the extra waiting time can be appropriately prevented from being generated due to delay of generation of the slice data. Due to this, for example, an unintended conspicuous streak can be prevented from being generated, and the high quality object 50 can be appropriately built. In this case, as illustrated in FIGS. 3B and 3C, for example, even in a case of building the object 50 that causes a problem in a simple RIP & building operation, the building operation can be appropriately performed in parallel with the processing of generating the slice data. Due to this, as compared with a case of performing building through the operation as illustrated in FIG. 3A, for example, the waiting time until building is started can be shortened, and the time required for building can be appropriately shortened.

Subsequently, the following describes a characteristic and the like of the building operation performed in the present embodiment in more detail. As described above, in the present embodiment, in a case of performing the building operation as illustrated in FIG. 3D, the slice data is started to be generated before the timing Tms for starting the building operation. In this case, the input data used for generating the slice data can be considered to be, for example, data of a building job and the like to be transmitted to the building apparatus 12. Thus, for example, the building operation illustrated in FIG. 3D can be considered to be an operation of slicing data in a queue of the building job in advance in a period in which the layer of the ink is not being formed by the building apparatus 12. In this case, the period in which the layer of the ink is not being formed by the building apparatus 12 means, for example, a period in which the building apparatus 12 is in an idle state. In this case, in a period before the timing Tms for starting the building operation, all pieces of slice data are not necessarily generated, but it is sufficient to generate at least pieces of slice data the number of which is sufficient for preventing the building operation from being temporarily stopped. In this case, the building operation is not started until a sufficient number of pieces of slice data are accumulated, and the building operation is started when the sufficient number of pieces of slice data are accumulated. The control unit 110 may set the timing Tms for starting the building operation after the data generation unit 108 starts to generate the slice data. In this case, for example, the timing Tms for starting the building operation may be set based on the time required for generating, by the data generation unit 108, pieces of slice data a number of which is set in advance. In this case, the operation of generating the slice data based on the input data and setting the timing Tms for starting the building operation based on the resulting time required for the processing and the like can be considered to be an example of an operation of setting the timing Tms based on the input data.

In a case of performing the building operation as illustrated in FIG. 3D, the timing Tms for starting the building operation may be set to have a certain margin. In this case, the time required for building may become longer than that in a case of performing the building operation as illustrated in FIG. 3C. By contrast, depending on the quality required for building, for example, it may be required to further shorten the time required for building rather than to prevent an unintended conspicuous streak and the like. In such a case, it is preferable to start to form the layer of the ink at a timing as early as possible rather than to set the timing Tms for starting the building operation based on the input data. Thus, in the building apparatus 12, the control unit 110 may determine whether to adjust the timing Tms for starting the building operation based on an instruction from the user. For example, if it is determined to adjust the timing Tms for starting the building operation, the control unit 110 sets the timing Tms for starting the building operation to prevent an unintended conspicuous streak, for example. In this case, for example, the control unit 110 sets the timing Tms for starting the building operation so that the interlayer time does not exceed the upper limit time as described above during a time when a plurality of layers of the ink are being formed. If it is determined not to adjust the timing Tms for starting the building operation, the control unit 110 sets the timing Tms for starting the building operation to start to form the layer of the ink as early as possible, for example. In this case, for example, the control unit 110 sets, as the timing Tms for starting the building operation, a timing matched with the timing Tss at which the data generation unit 108 starts to generate the slice data. The timing matched with the timing Tss for starting to generate the slice data is, for example, a timing at which the first layer of the ink is enabled to be formed after a plurality of pieces of slice data are started to be generated by the data generation unit 108. More specifically, the timing is, for example, a timing immediately after the data generation unit 108 generates the first piece of slice data. With this configuration, for example, the object 50 can be built more appropriately depending on the quality and the like required for building.

Subsequently, the following describes problems caused in a case in which the building operation is temporarily stopped in more detail. In a case of building the object 50 by depositing a building material (ink) by additive manufacturing, a periodic streak pattern (deposition streak) may be formed at an inclined portion of a surface of the object 50 due to an effect of a thickness of the layer of the ink, for example. However, typically, such a deposition streak is regularly formed at regular intervals, so that much sense of incongruity is hardly produced for appearance of the object 50. By contrast, in a case of performing the building operation in parallel with the processing of generating the slice data, when the building operation is temporarily stopped due to delay of generation of the slice data, for example, a state of the layer of the ink may be affected by that temporal stop and slightly changed as described above in some cases. As a result, appearance of a nearby streak may be affected thereby, and an unintended conspicuous streak may be formed. When such a conspicuous streak is formed, typically, the quality of the object 50 is deteriorated.

Figure 4:
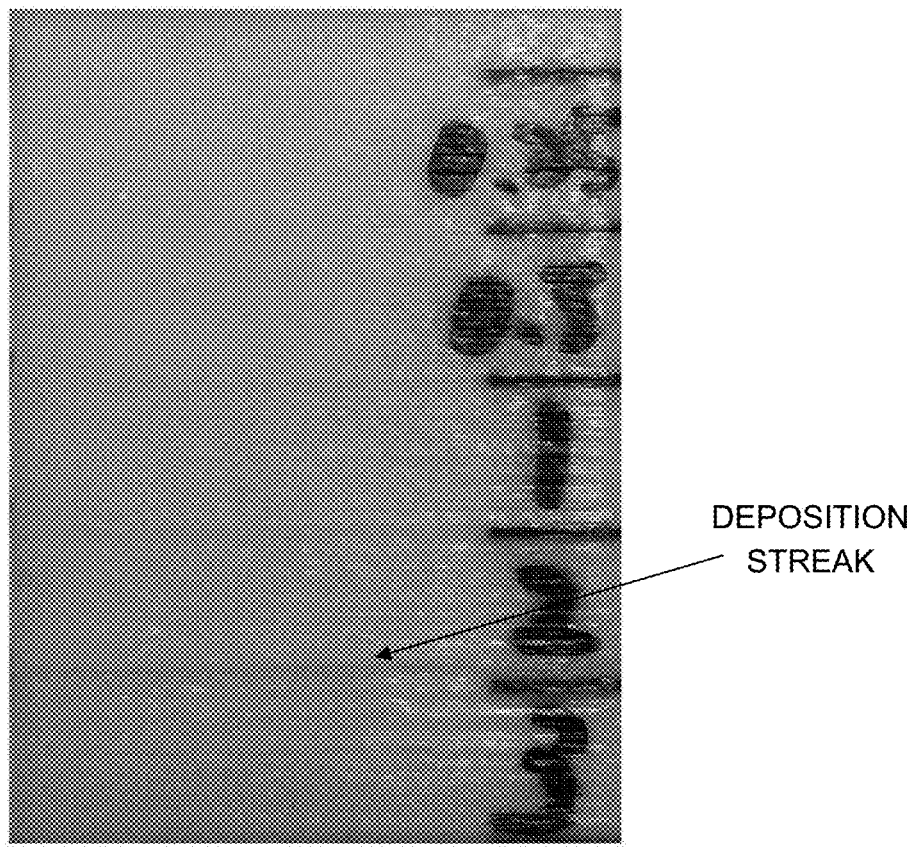
FIG. 4 is a diagram for explaining an experiment performed by the inventor of the present disclosure.

Regarding this point, the inventor of the present disclosure has checked an effect of a stop of the building operation through various experiments. FIG. 4 is a diagram for explaining the experiment performed by the inventor of the present disclosure, and illustrates part of the object, as a photograph, as a result of the experiment of performing building while changing a time in which the building operation is temporarily stopped. A numeral written on the object in the photograph denotes a time in which the building operation is temporarily stopped during a time of building (building stop time). As illustrated in the drawing, in this experiment, building is performed while changing the building stop time like 3 minutes, 2 minutes, 1 minute, 0.5 minute, and 0.25 minute to observe variance of a degree of conspicuousness of the deposition streak.

As is clear from the photograph, the deposition streak becomes very conspicuous as the building stop time is prolonged. In the present embodiment, as described above, by adjusting the timing Tms for starting the building operation, the building operation can be appropriately prevented from being stopped for a long time after the building operation is started, and the building operation can be continuously performed. Thus, according to the present embodiment, an unintended conspicuous streak can be appropriately prevented from being formed, for example. Due to this, for example, the high quality object 50 can be appropriately built.

In a case of building the object 50 using UV curable ink, when the ink is sufficiently cured at the time of forming each layer of the ink, the quality of the object 50 seems not to be affected even when the building operation is temporarily stopped. However, in a case of performing building by additive manufacturing, each of the layers of the ink to be deposited needs to be formed in a state in which sufficient adhesiveness is generated between the layers. Regarding this point, the UV curable ink is typically caused to be in a viscous state at the time when curing progresses to a certain degree, and caused to have high adhesiveness. By contrast, in a completely cured state, the UV curable ink is typically in a non-viscous state. Thus, in a case of building the object 50 using the UV curable ink, when the ink is completely cured at the time of forming each layer of the ink, adhesiveness between the layers may become insufficient in some cases. Thus, in forming each layer of the ink, it is preferable that the ink is not completely cured and kept in the viscous state at least at the time immediately after the layer is formed. More specifically, in this case, as a method of emitting ultraviolet rays by the UV light source 204 of the head 102, at the time of forming a lower layer of the ink in the operation of forming successive overlapped two layers of the ink, it is preferable to emit ultraviolet rays so that at least an upper surface of the lower layer of the ink has adhesiveness. With this configuration, for example, adhesiveness of the upper surface of the lower layer of the ink can be kept at least until an upper layer of the ink is started to be formed. For example, this state can be considered to be a state of keeping adhesiveness at least until the interlayer time has elapsed. However, in this case, the ink is not completely cured, so that the interlayer time is prolonged as the building stop time is prolonged. Accordingly, for example, flattening of dots of the ink constituting the layer of the ink progresses, and the state of the layer of the ink may be changed. As a result, as described above, the deposition streak becomes very conspicuous as the building stop time is prolonged.

In a case of performing building by additive manufacturing, even when each layer of the ink is not completely cured immediately after being formed, ultraviolet rays are further emitted at the time of forming the layer of the ink to be overlapped thereon, so that the layer of the ink may be typically completely cured by the time when the building is completed. In this case, ultraviolet rays for completely curing the ink may be emitted as needed at the end of the building operation, for example.

In a case of performing building by additive manufacturing, a plurality of main scanning operations may be performed in an operation of forming one layer of the ink. In this case, an idle time in such a plurality of main scanning operations seems to greatly affect the quality of the object 50. However, the deposition streak described above is a streak that is formed corresponding to the thickness of each layer of the ink. In a case of performing building by additive manufacturing, typically, as in the configuration described above, the layer of the ink is flattened by using a flattening module like the flattening roller 206 (refer to FIG. 1). In this case, following the flattening operation, the thickness of the layer of the ink is adjusted to be a predetermined thickness set in advance. Thus, in this case, even when an idle time between a plurality of main scanning operations in the operation of forming one layer of the ink varies, it can be considered that a final effect on the thickness of the layer of the ink is not substantially caused. From this point of view, to appropriately prevent an unintended conspicuous streak from being formed, as described above, it is important to prevent the interlayer time from being prolonged.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

INDUSTRIAL APPLICABILITY

The present disclosure can be preferably applied to a building apparatus, for example.

What is claimed is:

1. A building apparatus for building an object by depositing a material layer as a layer of a building material of the object in a deposition direction set in advance, the building apparatus comprising:
   a head, configured to eject the building material of the object;
   a data generation unit, configured to generate ejection position designating data as data indicating a position at which the head ejects the building material of the object; and a control unit, configured to control an operation of the head and an operation of the data generation unit, wherein the data generation unit generates the ejection position designating data based on input data indicating the object in a format different from a format of the ejection position designating data, and in a case in which an idle time after a lower material layer of two material layers that are successively overlapped in the deposition direction is formed until an upper material layer is started to be formed is defined as an interlayer time, during a time when the data generation unit performs an operation of generating the ejection position data in at least a part of a period of building the object, the control unit causes the head to form a plurality of material layers constituting at least a part of the object, and sets a layer forming start timing as a timing for starting to form the material layers so that the interlayer time does not exceed an upper limit time set in advance during a time when the material layers are being formed.

2. The building apparatus according to claim 1, wherein the control unit sets the layer forming start timing based on the input data so that the interlayer time does not exceed the upper limit time during the time when the material layers are being formed.

3. The building apparatus according to claim 1, wherein
the data generation unit generates, as the ejection position designating data, a plurality of pieces of slice data as a plurality of pieces of data indicating respective cross sections of the object at positions different from each other in the deposition direction, and the control unit causes the head to form the respective material layers constituting the object based on the pieces of slice data.

4. The building apparatus according to claim 3, wherein the control unit sets the layer forming start timing so that the slice data corresponding to the material layer is completely generated before each of the material layers is started to be formed.

5. The building apparatus according to claim 4, wherein
the data generation unit generates the respective pieces of slice data in order from the piece of slice data corresponding to the lower material layer in the deposition direction, and the control unit determines a number of pieces of preparation data as a number of pieces of slice data to be generated before the layer forming start timing based on the input data, and sets the layer forming start timing to start to form the material layers after the pieces of slice data corresponding to the number of pieces of preparation data are completely generated.

6. The building apparatus according to claim 1, further comprising:
a scanning driver, configured to cause the head to perform a main scanning operation of ejecting the building material while moving relatively to the object in a main scanning direction set in advance, wherein the control unit sets the layer forming start timing so that, regarding successive two main scanning operations, a time after a previous main scanning operation is completed until a subsequent main scanning operation is started does not exceed the upper limit time.

7. The building apparatus according to claim 6, wherein
the building material of the object is a material to be cured by being irradiated with ultraviolet rays, and
the head comprises:
an ejection head, configured to eject the building material; and
a UV light source, configured to emit the ultraviolet rays to the building material ejected by the ejection head.

8. The building apparatus according to claim 7, wherein, at a time of forming the lower material layer, the UV light source causes the building material constituting the lower material layer to be cured so that at least an upper surface of the lower material layer has adhesiveness.

9. The building apparatus according to claim 7, wherein the head further comprises a flattening module, configured to flatten the material layer by being brought into contact with the building material before curing.

10. The building apparatus according to claim 1, wherein
the control unit determines whether to adjust the layer forming start timing based on an instruction from a user, sets the layer forming start timing so that the interlayer time does not exceed the upper limit time during the time when the material layers are being formed, if it is determined to adjust the layer forming start timing, and sets, as the layer forming start timing, a timing matched with a timing at which the data generation unit starts to generate the ejection position data, if it is determined not to adjust the layer forming start timing.

11. A building method for building an object by depositing a material layer as a layer of a building material of the object in a deposition direction set in advance, the building method comprising:
using a head, configured to eject the building material of the object;
generating ejection position designating data based on input data indicating the object in a format different from a format of the ejection position designating data by a data generation unit, configured to generate the ejection position designating data as data indicating a position at which the head ejects the building material of the object; and in a case in which an idle time after a lower material layer of two material layers that are successively overlapped in the deposition direction is formed until an upper material layer is started to be formed is defined as an interlayer time, during a time when the data generation unit performs an operation of generating the ejection position data in at least a part of a period of building the object, causing the head to form a plurality of material layers constituting at least a part of the object, and setting a layer forming start timing as a timing for starting to form the material layers so that the interlayer time does not exceed an upper limit time set in advance during a time when the material layers are being formed.

\* \* \* \* \*